(12) United States Patent
Kim et al.

(10) Patent No.: US 11,970,579 B2
(45) Date of Patent: Apr. 30, 2024

(54) POLYAMIC ACID RESIN AND POLYAMIDEIMIDE FILM

(71) Applicants: SK Innovation Co., Ltd., Seoul (KR); SK Geo Centric Co., Ltd., Seoul (KR); SK IE Technology Co., Ltd., Seoul (KR)

(72) Inventors: Hyeon Jeong Kim, Daejeon (KR); Sang Yoon Park, Daejeon (KR); Tae Sug Jang, Daejeon (KR); Jin Hyung Park, Daejeon (KR)

(73) Assignees: SK Innovation Co., Ltd., Seoul (KR); SK Geo Centric Co., Ltd., Seoul (KR); SK ie technology Co., Ltd., Seoul (KR)

( * ) Notice: Subject to any disclaimer, the term of this patent is extended or adjusted under 35 U.S.C. 154(b) by 835 days.

(21) Appl. No.: 17/077,676

(22) Filed: Oct. 22, 2020

(65) Prior Publication Data

US 2021/0040267 A1 Feb. 11, 2021

Related U.S. Application Data

(63) Continuation-in-part of application No. 16/127,671, filed on Sep. 11, 2018, now Pat. No. 10,815,378.

(30) Foreign Application Priority Data

Sep. 12, 2017 (KR) .................. 10-2017-0116249

(51) Int. Cl.
*C08G 73/14* (2006.01)
*C08G 73/10* (2006.01)
*C08J 5/18* (2006.01)

(52) U.S. Cl.
CPC ......... *C08G 73/14* (2013.01); *C08G 73/1007* (2013.01); *C08G 73/1067* (2013.01); *C08J 5/18* (2013.01); *C08J 2379/08* (2013.01)

(58) Field of Classification Search
CPC ... C08G 73/14; C08G 73/1042; C08J 2379/08
See application file for complete search history.

(56) References Cited

U.S. PATENT DOCUMENTS

| 9,580,555 | B2 | 2/2017 | Ju et al. |
| 10,072,180 | B2 | 9/2018 | Choi et al. |
| 10,370,496 | B2 | 8/2019 | Park et al. |
| 10,662,290 | B2 | 5/2020 | Kim et al. |
| 2016/0319076 | A1 | 11/2016 | Ju et al. |
| 2017/0329062 | A1 | 11/2017 | Nakajima et al. |

FOREIGN PATENT DOCUMENTS

| JP | 2002161136 A | | 6/2002 |
| JP | 2005298625 | * | 10/2005 |
| JP | 2010282922 A | | 12/2010 |
| JP | WO2015122032 A1 | | 3/2017 |
| KR | 1020130035691 A | | 4/2013 |
| KR | 1020130071650 A | | 7/2013 |
| KR | 1020150076114 A | | 7/2015 |
| KR | 1020160081829 A | | 7/2016 |
| KR | 1020160094086 A | | 8/2016 |

OTHER PUBLICATIONS

Grabiec et al Physical, optical and gas transport properties of new processable polyimides and poly(amideimide)s obtained from 4,4¢-[oxybis(4, 1-phenylenethio)]dianiline and aromatic dianhydrides, Polymer Journal (2011) 43, 621-629, published online Apr. 20, 2011.*

* cited by examiner

*Primary Examiner* — Gregory Listvoyb
(74) *Attorney, Agent, or Firm* — The Webb Law Firm

(57) ABSTRACT

Provided are a polyamic acid resin derived from an aromatic diamine, an aromatic dianhydride, a cycloaliphatic dianhydride and an aromatic diacid dichloride, and a polyamideimide film including polyamideimide derived from an aromatic diamine, an aromatic dianhydride, a cycloaliphatic dianhydride and an aromatic diacid dichloride.

10 Claims, No Drawings

POLYAMIC ACID RESIN AND POLYAMIDEIMIDE FILM

CROSS-REFERENCE TO RELATED APPLICATIONS

This application is a continuation-in-part of U.S. patent application Ser. No. 16/127,671, filed Sep. 11, 2018, which claims priority under 35 U.S.C. § 119 to Korean Patent Application No. 10-2017-0116249, filed on Sep. 12, 2017, in the Korean Intellectual Property Office, the disclosures of which are incorporated herein by reference in their entireties.

TECHNICAL FIELD

The following disclosure relates to a polyamic acid resin and a polyamideimide film.

Particularly, the following disclosure relates to a polyamideimide film having excellent UV protection properties, adjusted optical properties, and being capable of implementing a high modulus, by providing a polyamic acid resin derived from a combination of specific components, and a polyamideimide film including polyamideimide derived therefrom.

BACKGROUND

In general, polyimide has excellent mechanical and thermal properties, thereby being applied to various fields including an insulating substrate field for forming circuits and devices. However, since a charge transfer complex is formed between aromatic rings at the time of polymerization to cause polyimide to be brown or yellow colored, leading to low light transmittance in the visible light region, it is difficult to apply the polyimide to display materials and there is also still a need to improve UV protection ability.

As a method of improving the light transmittance of the polyimide to make the polyimide colorless and transparent, a method of using an alicyclic diamine or an aliphatic diamine as a diamine component to inhibit formation of an intramolecular charge transfer complex is known in the art. Japanese Patent Laid-Open Publication No. 2002-161136 (Patent Document 1) discloses polyimide obtained by imidizing a polyimide precursor formed by an aromatic acid dianhydride such as pyromellitic dianhydride and trans-1,4-diaminocyclohexane, however, which represents high transparency but has deteriorated mechanical physical properties.

As such, as a method for converting the yellow color of polyimide to be colorless and transparent, an attempt has been made to use various functional monomers. However, since a polyimide film having a high light transmittance in the visible light region also has a high light transmittance value in a short wavelength region of 400 nm or less, when the film is exposed to ultraviolet rays, damage due to ultraviolet rays occurred in a lower laminate structure of a display including the polyimide film. In order to solve the problem, it was intended to use a widely used ultraviolet ray absorber or ultraviolet ray stabilizer, however, polyimide is processed at high temperature so that it is hard to use an additive, and even in the case of using the additive, a yellow index was increased.

In particular, when a light transmittance in a short wavelength area of 400 nm or less is high, in the case in which a window cover film of a flexible display in which the polyimide or polyamideimide film is mainly used is used, an OLED device is disposed on an inner side of the window cover film, but a problem that the OLED device is deteriorated by UV from sunlight and the performance is rapidly degraded, was not solved. Specifically, OLED itself may be damaged so that visibility is deteriorated and screen brightness becomes weak.

Thus, it is currently needed to develop a technology for polyimide in which its excellent inherent mechanical physical properties are not deteriorated by implementing a high modulus so as to be applied to various display material fields, a haze is as low as 2%, and damage of a lower laminate structure of a display including a polyimide film due to ultraviolet rays may be prevented by decreasing a light transmittance in a short wavelength region of 400 nm or less, so that the coverage may be further broadened.

RELATED ART DOCUMENT

Patent Document (Patent Document 1) Japanese Patent Laid-Open Publication No. 2002-161136 (Jun. 4, 2002)

SUMMARY

An embodiment of the present invention is directed to providing a polyamideimide or a polyimide and a polyamic acid as a precursor providing the polyamideimide or the polyimide, having properties of a total light transmittance in the visible light region of 89% or more, a haze of 2% or less, and a modulus of 5 GPa or more, and simultaneously having a surprising UV protection properties of a light transmittance at 388 nm of 5% or less, preferably 1% or less, and more preferably 0.4% or less.

In addition, an embodiment of the present invention is directed to providing a polyimide or a polyamideimide film capable of preventing ultraviolet ray-induced damage by ultraviolet ray exposure to a lower structure of a display including the polyamideimide film.

In one general aspect, a polyamideimide film includes polyamideimide derived from an aromatic diamine, an aromatic dianhydride, a cycloaliphatic dianhydride and an aromatic diacid dichloride, wherein the cycloaliphatic dianhydride includes a compound represented by the following Chemical Formula 1, and the polyamideimide film may have a total light transmittance of 89% or more, and a light transmittance measured at 388 nm of 10% or less, as measured in accordance with the ASTM D1003 standard:

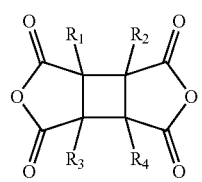

[Chemical Formula 1]

Wherein $R_1$ to $R_4$ are independently of one another, selected from the group consisting of hydrogen, halogen, a $C_1$ to $C_{10}$ alkyl group or a $C_1$ to $C_{10}$ alkoxy group.

According to an exemplary embodiment of the present invention, the aromatic diamine may include 2,2'-bis(trifluoromethyl)-benzidine.

According to an exemplary embodiment of the present invention, the aromatic dianhydride may include any one or more selected from 4,4'-hexafluoroisopropylidene diphthalic anhydride and biphenyltetracarboxylic dianhydride, and simultaneously with the aromatic dianhydride, may include TBIS-BAN (CAS No. 867350-98-9) represented by the following Chemical Formula 2 as the aromatic dianhydride for satisfying the UV protection properties of the present invention.

A content of the aromatic dianhydride of the following Chemical Formula 2 may be 1 to 30 mol %, preferably 2 to 20 mol %, based on 100 mol of the aromatic diamine, but is not limited under the premise of achieving the object of the present invention.

thickness of 55 μm. In addition, a haze may be 2% or less, preferably 1% or less, and more preferably 0.5% or less.

In another general aspect, an image display device includes the polyamideimide film as described above.

Other features and aspects will be apparent from the following detailed description, the drawings, and the claims.

DETAILED DESCRIPTION OF EMBODIMENTS

Hereinafter, the present invention will be described in more detail. However, the following exemplary embodi-

[Chemical Formula 2]

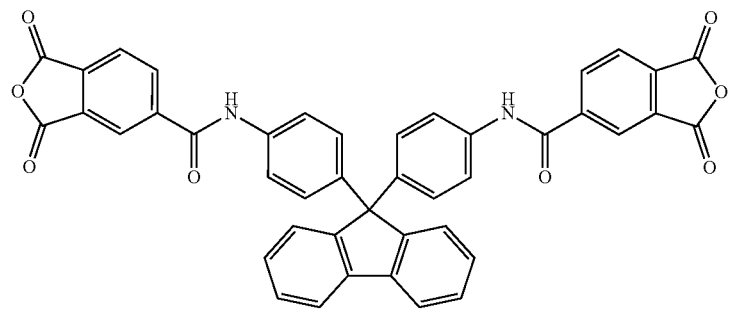

In addition, according to an exemplary embodiment of the present invention, the aromatic diacid dichloride may include terephthaloyl dichloride.

According to an exemplary embodiment of the present invention, a content of the aromatic diacid dichloride may be more than 50 mol, based on 100 mol of the aromatic diamine.

According to an exemplary embodiment of the present invention, a content of the aromatic dianhydride may be 10 to 50 mol, based on 100 mol of the aromatic diamine.

According to an exemplary embodiment of the present invention, a content of the aromatic dianhydride may be 5 to 25 mol of 4,4'-hexafluoroisopropylidene diphthalic anhydride and 1 to 30 mol of the IBIS-BAN, based on 100 mol of the aromatic diamine.

According to an exemplary embodiment of the present invention, a content of the cycloaliphatic dianhydride may be 5 to 30 mol, based on 100 mol of the aromatic diamine.

According to an exemplary embodiment of the present invention, the polyamideimide film may have a modulus of 4.0 GPa or more, as measured at an extension speed of 25 mm/min using UTM 3365 available from Instron.

According to an exemplary embodiment of the present invention, the polyamideimide film may have a modulus of 4.0 GPa or more, as measured at an extension speed of 25 mm/min using UTM 3365 available from Instron for a specimen having a thickness of 55 μm, a length of 50 mm and a width of 10 mm.

According to an exemplary embodiment of the present invention, the polyamideimide film may have a total light transmittance of 88% or more, preferably 89% or more, as measured in accordance with the ASTM D1003 standard, based on a film having a thickness of 55 μm.

According to an exemplary embodiment of the present invention, the polyamideimide film may have a light transmittance of 10% or less, preferably 2% or less, more preferably 1.4% or less, and still more preferably 0.1% or less, as measured at 388 nm, based on a film having a ments and Examples are only a reference for describing the present invention in detail, and the present invention is not limited thereto, and may be implemented in various forms.

In addition, unless otherwise defined, all technical terms and scientific terms have the same meanings as those commonly understood by a person skilled in the art to which the present invention pertains.

The terms used herein is only for effectively describing a certain exemplary embodiment, and not intended to limit the present invention.

Throughout the present specification describing the present invention, unless explicitly described to the contrary, "comprising" any elements will be understood to imply further inclusion of other elements rather than the exclusion of any other elements.

In addition, the singular form used in the specification and claims appended thereto may be intended to also include a plural form, unless otherwise indicated in the context.

In addition, "a polyamic acid solution", which is a solution formed by mixing monomers in an organic solvent, refers to containing a polyamic acid resin obtained by copolymerization of monomers in the organic solvent.

The inventors of the present invention provide a polyamideimide film including an aromatic diamine, an aromatic dianhydride, a cycloaliphatic dianhydride and an aromatic diacid dichloride.

That is, a polyamideimide from a polyamic acid resin having a combination of a specific aromatic diamine, an aromatic dianhydride having a specific structure, a cycloaliphatic dianhydride, and an aromatic diacid dichloride is derived, thereby providing a film having surprising performance of a surprisingly excellent modulus, an increased light transmittance over an entire region of visible light, a low haze, and a significantly decreased light transmittance in a UV region. In particular, it was found that a polyamideimide film preventing damage due to ultraviolet rays in a lower structure of a display including the polyamideimide film may be provided by significantly decreasing a light transmittance in a short wavelength region, thereby completing the present invention.

Specifically, in order to provide a resin and a film which may be applied various display fields by improving optical properties as well as mechanical and thermal properties, the present invention provides a polyamic acid resin including a specific aromatic diamine, an aromatic dianhydride including TBIS-BAN (CAS No. 867350 98-9) represented by Chemical Formula 2, a cycloaliphatic dianhydride and an aromatic diacid dichloride, and a polyamideimide film derived therefrom.

According to an exemplary embodiment of the present invention, the cycloaliphatic dianhydride includes a compound represented by the following Chemical Formula 1 and the aromatic dianhydride includes IBIS-BAN (CAS No. 867350 98-9) represented by Chemical Formula 2, and the polyamideimide film may show surprising blocking properties of a total light transmittance of 88% or more, preferably 89% or more, and a light transmittance measured at 388 nm of 10% or less, preferably 2% or less, more preferably 1.4% or less, and still more preferably 0.1% or less, as measured in accordance with the ASTM D1003 standard:

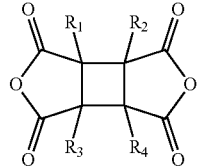

[Chemical Formula 1]

wherein
$R_1$ to $R_4$ are independently of one another, selected from the group consisting of hydrogen, halogen, a $C_1$ to $C_{10}$ alkyl group or a $C_1$ to $C_{10}$ alkoxy group,

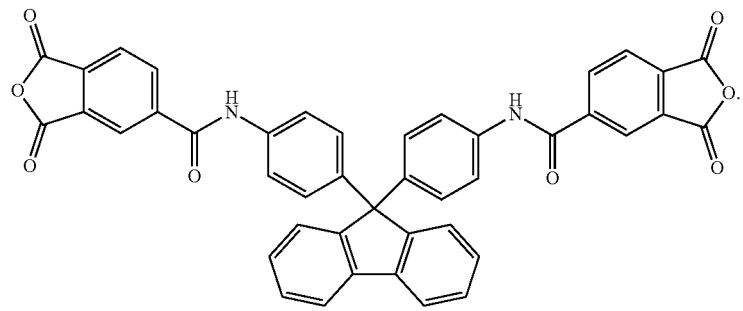

[Chemical Formula 2]

Preferably, according to an exemplary embodiment of the present invention, the present invention relates to a polyamideimide film including polyamideimide derived from an aromatic diamine, an aromatic dianhydride including an aromatic dianhydride having a specific structure of Chemical Formula 2, a cycloaliphatic dianhydride, and an aromatic diacid dichloride, wherein the aromatic diamine includes 2,2'-bis(trifluoromethyl)-benzidine, the aromatic dianhydride may include 4,4'-hexafluoroisopropylidene diphthalic anhydride and a monomer of the following Chemical Formula 2:

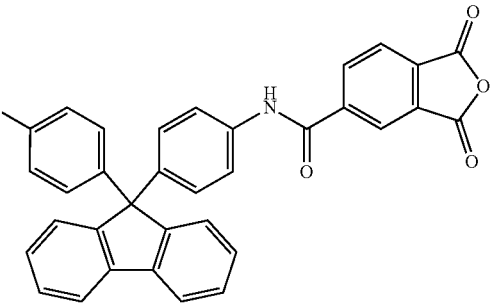

[Chemical Formula 2]

(TBIS-BAN)

In addition, the cycloaliphatic dianhydride may include a compound represented by the following Chemical Formula 1, and the aromatic diacid dichloride may provide a polyamideimide film including terephthaloyl dichloride:

[Chemical Formula 1]

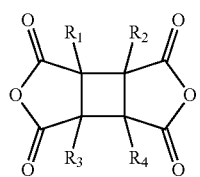

wherein

R₁ to R₄ are independently of one another, selected from the group consisting of hydrogen, halogen, a $C_1$ to $C_{10}$ alkyl group or a $C_1$ to $C_{10}$ alkoxy group.

According to an exemplary embodiment of the present invention, the polyamideimide film may have a total light transmittance of 88% or more, as measured in accordance with the ASTM D1003 standard. Preferably the total light transmittance may be 89% or more. Specifically, the total light transmittance may be 88 to 99%. More preferably, the total light transmittance may be 89 to 95%. Here, the total light transmittance may be measured, based on a specimen having a thickness of 55 μm.

In addition, according to an exemplary embodiment of the present invention, the polyamideimide film imparts surprising UV protection properties of a light transmittance of 10% or less, preferably 2% or less, more preferably 1.4% or less, and still more preferably 0.1% or less, as measured at 388 nm using UV-3600 available from Shimadzu. Here, the light transmittance measured at 388 nm may be measured, based on a specimen having a thickness of 55 μm.

The polyamideimide film including the polyamideimide by the combination of the present invention as described above may increase a light transmittance over an entire wavelength region of visible light while having an excellent modulus. In particular, at the same time, as the light transmittance is surprisingly significantly decreased in a short wavelength region, damage due to ultraviolet rays in a lower structure of a display including the polyamideimide film may be prevented without an ultraviolet additive. In addition, since the ultraviolet additive is not included, deterioration of physical properties of polyamideimide may be prevented, and thus, the film is preferred.

According to an exemplary embodiment of the present invention, the cycloaliphatic dianhydride may include a compound represented by the following Chemical Formula 1:

[Chemical Formula 1]

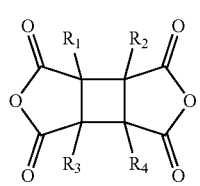

wherein

R₁ to R₄ may be independently of one another, selected from the group consisting of hydrogen, halogen, a $C_1$ to $C_{10}$ alkyl group or a $C_1$ to $C_{10}$ alkoxy group.

Preferably, in Chemical Formula 1, R₁ to R₄ may be independently of one another hydrogen or a $C_1$ to $C_{10}$ alkyl group.

More preferably, in Chemical Formula 1, R₁ to R₄ may be independently of one another hydrogen or a $C_1$ to $C_5$ alkyl group.

Most preferably, specifically for example, 1,2,3,4-cyclobutanetetracarboxylic dianhydride (CBDA) may be included.

When the cycloaliphatic dianhydride is included, a light transmittance in a visible light region of the polyamideimide film prepared by the combination of the aromatic diamine, the aromatic dianhydride including the aromatic dianhydride having the specific structure of Chemical Formula 2, and the aromatic diacid dichloride as described above, may be improved, and simultaneously, a light transmittance in a UV region of the film may be significantly lowered.

According to an exemplary embodiment of the present invention, a content of the cycloaliphatic dianhydride may be 5 to 30 mol, based on 100 mol of the aromatic diamine. Preferably, the content may be 5 to 20 mol. When the cycloaliphatic dianhydride is included at the content, a yellow index is significantly decreased, and a light transmittance over an entire wavelength region of visible light may be increased, which is thus preferred.

The aromatic diamine according to an exemplary embodiment of the present invention may include 2,2'-bis(trifluoromethyl)-benzidine. The aromatic diamine may impart excellent optical properties by a charge transfer effect of fluorine substituents, and 2,2'-bis(trifluoromethyl)-benzidine may provide polyamideimide which is an imidized product of a polyamic acid resin with a combination of an aromatic dianhydride, a cycloaliphatic dianhydride and an aromatic diacid dichloride, thereby implementing optical properties to be desired depending on a wavelength region, and also excellent mechanical physical properties.

Here, the aromatic diamine may be used by mixing 2,2'-bis(trifluoromethyl)-benzidine and other known aromatic diamine components, however, it is more preferred to use 2,2'-bis(trifluoromethyl)-benzidine alone for implementing the effect to be achieved.

The dianhydride according to an exemplary embodiment of the present invention includes the aromatic dianhydride and the cycloaliphatic dianhydride, and the aromatic dianhydride necessarily includes the aromatic dianhydride of the following Chemical Formula 2:

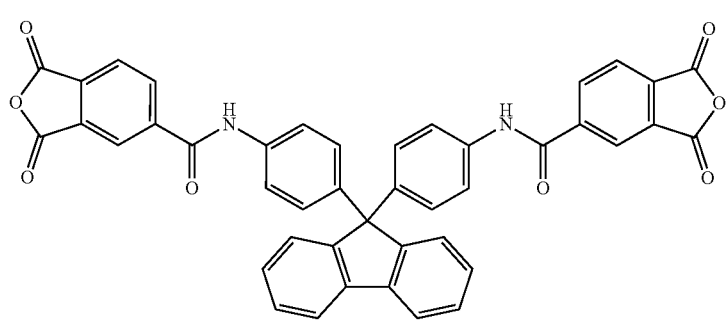

[Chemical Formula 2]

(TBIS-BAN)

The aromatic dianhydride of the present invention except the aromatic dianhydride of Chemical Formula 2 is for example, any one or a mixture of two or more selected from the group consisting of 4,4'-hexafluoroisopropylidene diphthalic anhydride (6-FDA), biphenyltetracarboxylic dianhydride (BPDA), 1,2,4,5-benzenetetracarboxylic dianhydride (PMDA), benzophenonetetracarboxylic dianhydride (BTDA), 4,4'-oxydiphthalic dianhydride (ODPA), bisdicarboxyphenoxy diphenylsulfide dianhydride (BDSDA), TBIS-MPN (CAS No.933041-59-9) and the like. It is more preferred to use only 4,4'-hexafluoroisopropylidene diphthalic anhydride and IBIS-BAN (CAS No. 867350 98-9) represented by Chemical Formula 2 for implementing the physical property effect to be desired.

A total content of the aromatic dianhydride according to an exemplary embodiment of the present invention is not particularly limited as long as the object of the present invention is achieved, but for example, may be 10 to 50 mol, based on 100 mol of the aromatic diamine. Preferably, the content may be 10 to 40 mol. More preferably, the content may be 20 to 40 mol.

In addition, a content of the IBIS-BAN monomer of Chemical Formula 2 in the aromatic dianhydride may be 1 to 30 mol, preferably 2 to 30 mol, based on 100 mol of the aromatic diamine, and it is preferred that the content is not more than 50 mol% of the total aromatic dianhydride content in a range of not damaging mechanical physical properties or optical physical properties, but is not necessarily limited thereto.

More preferably, a content of the aromatic dianhydride according to an exemplary embodiment of the present invention may be 5 to 25 mol of 4,4'-hexafluoroisopropylidene diphthalic anhydride and 1 to 30 mol of the IBIS-BAN monomer, based on 100 mol of the aromatic diamine.

Preferably, the content may be 10 to 20 mol of 4,4'-hexafluoroisopropylidene diphthalic anhydride and 2 to 20 mol of the IBIS-BAN monomer.

Within the range of the content, when the polyamideimide film is prepared, the light transmittance is significantly decreased in a short wavelength region, and damage due to ultraviolet rays in a lower structure of a display including the polyamideimide film may be prevented, which is preferred.

According to an exemplary embodiment of the present invention, the aromatic diacid dichloride includes terephthaloyl dichloride for being reacted with the aromatic diamine to form an amide structure in a high molecular chain. Besides, other known aromatic diacid dichloride may be further included. Specifically for example, any one or a mixture of two or more selected from the group consisting of 1,4-naphthalene dicarboxylic dichloride, 2,6-naphthalene dicarboxylic dichloride, 1,5-naphthalene dicarboxylic dichloride and the like may be used. It is preferred to use terephthaloyl dichloride alone for adjusting optical properties depending on the range of the polyamideimide film, and also significantly improving the modulus.

According to an exemplary embodiment of the present invention, a content of the aromatic diacid dichloride may be more than 50 mol, based on 100 mol of the aromatic diamine. Preferably, the content may be 55 mol or more. Specifically, the content may be 55 to 90 mol, preferably 55 to 80 mol, more preferably 55 to 75 mol.

When the content satisfies the range, the physical property balance to be desired, that is, a high light transmittance over an entire region of visible light without deteriorating mechanical and thermal physical properties may be implemented, with the combination of other components. Besides, by implementing a low light transmittance even in a short wavelength region of 400 nm or less, damage due to ultraviolet rays in a lower structure of a display including the polyamideimide film may be prevented. In addition, a synergistic effect of dramatically improving a modulus may be implemented.

By copolymerizing a high content of the aromatic diacid dichloride as described above, the polyamideimide film prepared therefrom has dramatically improved optical properties, and at the same time may implement a high modulus, which are preferred.

In particular, there was difficulty in using the aromatic diacid dichloride at a high content more than 50 mol, based on the diamine due to gelation and the like during a polymerization reaction. Thus, conventionally, in order to use the aromatic diacid dichloride at a high content, lithium chloride, calcium chloride or the like was used together, however, these compounds leave a chloride ion to have a bad influence on the environment or deteriorate the physical properties of the film. In order to solve the problems, in the present invention, a compositional ratio depending on a combination with other components including the aromatic diamine, the aromatic dianhydride and the cycloaliphatic dianhydride, and a reaction order and a polymerization concentration of the reaction components may be adjusted to dramatically increase the content of the aromatic diacid dichloride, thereby achieving the physical property effect to be desired.

Since the specific example, content and the like of the above-described aromatic diamine, aromatic dianhydride, cycloaliphatic dianhydride and aromatic diacid dichloride are described above, detailed description will be omitted.

In the present invention, the polyamic acid resin which is a precursor before preparing polyamideimide may be preferably a resin produced by copolymerizing an aromatic diamine, an aromatic dianhydride including a TRIS-BAN monomer, a cycloaliphatic dianhydride and an aromatic diacid dichloride.

Specifically, a polyamic acid resin wherein the aromatic diamine includes 2,2'-bis(trifluoromethyl)-benzidine, and the aromatic dianhydride includes 4,4'-hexafluoroisopropylidene diphthalic anhydride and biphenyltetracarboxylic dianhydride, the cycloaliphatic dianhydride includes a compound represented by the following Chemical Formula 1, and the aromatic diacid dichloride includes terephthaloyl dichloride, may be provided.

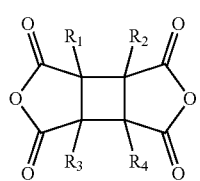

[Chemical Formula 1]

wherein $R_1$ to $R_4$ may be independently of one another, selected from the group consisting of hydrogen, halogen, a $C_1$ to $C_{10}$ alkyl group or a $C_1$ to $C_{10}$ alkoxy group.

In the present invention, an equivalent ratio of the aromatic diamine and a mixture of the aromatic dianhydride including the IBIS-BAN monomer, the cycloaliphatic dianhydride and the aromatic diacid dichloride is preferably 0.9:1 to 1.1:1, and more preferably 1:1. When the range is satisfied, the physical properties of the film including the film forming properties are improved when forming a film from polyamideimide which is obtained by imidizing the polyamic acid resin derived from the monomer, which is more preferred.

The polyamic acid resin may be provided as a polyamic acid solution dissolved in a solvent, and the polyamic acid solution is a solution of the above-described monomers, and may include an organic solvent for a solution polymerization reaction. The kind of the organic solvent is not particularly limited, and specifically for example, it is preferred to use any one or two or more selected from the group consisting of dimethylacetamide (DMAc), N-methyl-pyrrolidone (NMP), dimethylformamide (DMF), dimethylsulfoxide (DMSO), acetone, diethylacetamide, m-cresol and the like.

In the present invention, the polyamic acid solution including the polyamic acid resin and the solvent may be imidized by further including any one or two or more selected from the group consisting of an imidization catalyst and a dehydrating agent, in addition to the polyamic acid resin.

As the imidization catalyst, any one or more selected from the group consisting of pyridine, isoquinoline and β-quinoline may be used. In addition, as the dehydrating agent, any one or more selected from the group consisting of an acetic anhydride, a phthalic anhydride and a maleic anhydride may be used, but not necessarily limited thereto.

Any one or a mixture of two or more selected from the group consisting of the imidization catalyst and the dehydrating agent according to an exemplary embodiment of the present invention may be included at 1 to 5 mol, based on 1 mol of the aromatic dianhydride and the cycloaliphatic dianhydride. Preferably, 1.5 to 3 mol may be included, but not limited thereto.

In the present invention, the polyamic acid solution may be imidized to obtain the polyamideimide film. Here, imidization may be carried out using a known imidization method. Chemical imidization is preferred. Chemical imidization of the polyamic acid solution by including pyridine and an acetic anhydride is more preferred.

The polyamic acid solution according to the present invention may further include various forms of additives. As the additive, any one or two or more selected from the group consisting of a flame retardant, an adhesion improver, inorganic particle, an antioxidant, an ultraviolet ray inhibitor, a plasticizer, an antistatic agent and the like may be further included, but not necessarily limited thereto.

In addition, the present invention provides an image display device including the above-described polyamideimide film.

The present invention provides a method for preparing a polyamideimide film including the following steps:

(a) dissolving an aromatic diamine in an organic solvent, then adding an aromatic dianhydride, a cycloaliphatic dianhydride and an aromatic diacid dichloride thereto, and performing a reaction to prepare a polyamic acid solution;

(b) imidizing the polyamic acid solution to prepare polyamideimide; and (c) coating a polyamide imide solution in which the polyamideimide is dissolved in an organic solvent.

In the present invention, the method for preparing a polyamideimide film is not particularly limited, however, it is preferred to perform the method using a reactor equipped with a stirrer, a nitrogen injection apparatus, a dropping apparatus, a temperature controller and a cooler.

According to an exemplary embodiment of the present invention, step (a) of preparing a polyamic acid solution may be to add an organic solvent in a reactor, dissolve an aromatic diamine therein, then react an aromatic dianhydride and a cycloaliphatic dianhydride, and then add an aromatic diacid dichloride to perform the reaction.

In addition, another exemplary embodiment of (a) preparing a polyamic acid solution may be to add an organic solvent to a reactor, dissolve an aromatic diamine therein, then perform a reaction with an aromatic diacid dichloride, and then react an aromatic dianhydride and a cycloaliphatic dianhydride. This is more preferred, since the content of the aromatic diacid dichloride in a finally obtained polymer may be increased, that is, polymerization reaction uniformity is excellent in spite of a high solid content, and a high modulus may be implemented, in addition to excellent optical properties.

According to an exemplary embodiment of the present invention, when preparing the polyamic acid solution, the reaction is performed by adding the aromatic diamine not altogether, but stepwisely to the organic solvent, for increasing reactivity. In addition, it is preferred to firstly add the aromatic diamine to the organic solvent, and then sufficiently dissolve the aromatic diamine. Here, the organic solvent to be used is as described above, and it is preferred to use dimethyl acetamide or N-methyl-2-pyrrolidone. In addition, the content of the organic solvent may be properly selected considering the molecular weight of polyamideimide which is a copolymerized product derived from the monomers, and may be 80 to 97 wt % in the entire composition. The content is preferably 85 to 95 wt %, more preferably 87 to 95 wt %. That is, the solid content is 3 to 20 wt %, preferably 5 to 15 wt %, and more preferably 5 to 13 wt %.

When the content of the organic solvent is less than 80 wt %, gelation may occur during a polymerization process, a uniform solution may be difficult to be obtained, a solution having a high viscosity out of an available range is formed, so that purification using the solvent may not be easy. As such, when the purification is not done well, optical properties such as a light transmittance and a yellow index may be deteriorated when forming a film. In addition, when the content of the organic solvent is more than 97 wt %, solution formation is possible, but the yield of polyamideimide may be decreased.

Step (a) is performed under an inert gas atmosphere, specifically for example, with nitrogen or argon gas refluxed in the reactor. In addition, a reaction temperature range is from room temperature to 80° C., specifically 20 to 80° C., and a reaction time is 30 minutes to 24 hours, but not limited thereto.

Step (b) of imidization is to imidize the polyamic acid solution prepared in step (a) to obtain polyamideimide, and a known imidization method, for example, a thermal imidization method, a chemical imidization method, and a combination of a thermal imidization method and a chemical imidization method may be applied. It is preferred to subject the solution to chemical imidization, but not limited thereto.

In addition, the imidization may be performed before or after coating a polyamideimide solution, and applied by the known various methods, and thus, is not limited.

In the present invention, the chemical imidization may be performed by further including any one or two or more selected from the group consisting of an imidization catalyst and a dehydrating agent in the prepared polyamic acid solution. It is preferred that the chemical imidization is performed by adding any one or two or more selected from the group consisting of an imidization catalyst and a dehydrating agent to the polyamic acid solution prepared in step (a), in terms of the physical properties of the obtained polyamideimide. More preferably, any one or two or more selected from the group consisting of an imidization catalyst and a dehydrating agent are added to the polyamic acid solution to perform imidization, and then purification using a solvent is performed to obtain a solid content, which is dissolved in the solvent to obtain the polyamideimide solution.

Here, as the dehydrating agent, any one or more selected from the group consisting of acetic anhydride, phthalic anhydride and maleic anhydride may be used, and as the imidization catalyst, any one or more selected from the group consisting of pyridine, isoquinoline and β-quinoline may be used, but not limited thereto.

According to an exemplary embodiment of the present invention, it is preferred to use a solvent which may significantly decrease the solubility of the solid content of polyamideimide, specifically for example, any one or more selected from the group consisting of water and alcohol, as the solvent used in the purification after imidizing the polyamic acid solution.

When the solid content of polyamideimide is obtained by purification, and then dissolved in the organic solvent to obtain imidized polyamideimide, as the organic solvent to be used, a solvent identical to or different from the organic solvent used when preparing the polyamic acid solution may be used. Here, the content of the solvent may be 70 to 95 wt %. The content is preferably 75 to 95 wt %, more preferably 80 to 90 wt %.

In addition, when a viscosity of the polyamideimide solution prepared by dissolving the finally obtained polyamideimide in the solvent is measured, the viscosity may be 5,000 to 500,000 cps, preferably 8,000 to 300,000 cps, more preferably 10,000 to 200,000 cps. Here, the viscosity is measured using a Brookfield viscometer at 25° C.

The polyamideimide obtained in the present invention has a weight average molecular weight of 50,000 to 1,000,000 g/mol, preferably 50,000 to 800,000 g/mol, and more preferably 50,000 to 500,000 g/mol. Here, the weight average molecular weight is measured with polystyrene as a standard sample using 1260 Infinity available from Agilent Technologies, in which PL gel Olexis was used as a column, and 4 mg contained in 100 ml of LiCl at 0.5 wt % with DMAc as a solvent was used as the sample. In addition, the polyamideimide may have a glass transition temperature of 200 to 400° C., preferably 320 to 390° C.

Step (c) of coating a polyamideimide solution in which the polyamideimide is dissolved in the solvent and subjecting the coated solution to heat treatment may be further included. The heat treatment step is to cast the polyamideimide solution on a substrate such as a glass substrate and subject the cast solution to heat treatment to form a film. Here, the term "polyamideimide solution" described in step (c) refers to a coating composition for preparing a polyamideimide film containing polyamideimide.

According to an exemplary embodiment of the present invention, it is preferred that the heat treatment is stepwisely performed as an example. Preferably, the heat treatment may be stepwisely performed at 80 to 100° C. for 1 minute to 2 hours, at 100 to 200° C. for 1 minute to 2 hours, or at 250 to 300° C. for 1 minute to 2 hours. More preferably, the stepwise heat treatment depending on each temperature range is performed for 30 minutes to 2 hours. Here, it is more preferred to perform the stepwise heat treatment by heating in a range of preferably 1 to 20° C./min when moving to each step. In addition, the heat treatment may be performed in a separate vacuum oven, but not necessarily limited thereto.

According to an exemplary embodiment of the present invention, the coating may be performed using an applicator considering a thickness of the prepared film to form the film on the substrate, and the film thickness may be 10 to 100 μm, preferably 20 to 90 μm, but not limited thereto.

According to an exemplary embodiment of the present invention, the polyamideimide film may have a modulus of 4.0 GPa or more, as measured at an extension speed of 25 mm/min using UTM 3365 available from Instron. Specifically, the modulus may be 4.0 to 10 GPa, preferably 4.0 to 8.0 GPa. Here, the modulus may be measured, based on a specimen having a thickness of 55 μm, a length of 50 mm and a width of 10 mm.

In addition, according to an exemplary embodiment of the present invention, the polyamideimide film may have a total light transmittance of 88% or more, as measured in accordance with the ASTM D1003 standard. Preferably the light transmittance may be 89% or more. Specifically, the total light transmittance may be 88 to 99%. Preferably, the total light transmittance may be 89 to 95%. Here, the total light transmittance may be measured, based on a specimen having a thickness of 55 μm.

In addition, according to an exemplary embodiment of the present invention, the polyamideimide film may have a light transmittance of 10% or less, as measured at 388 nm using UV-3600 available from Shimadzu. Preferably, the light transmittance may be 2% or less. More preferably, the polyamideimide film has surprising UV protection properties of 1.4% or less. Here, the light transmittance measured at 388 nm may be measured, based on a specimen having a thickness of 55 μm.

In addition, a haze according to ASTM D1003 may be 2% or less, preferably 1% or less, and more preferably 0.5% or less. Here, the haze may be measured based on a specimen having a thickness of 55 μm.

As described above, the polyamideimide film capable of implementing excellent physical properties may be derived from the aromatic diamine, the aromatic dianhydride including the IBIS-BAN monomer of Chemical Formula 2, the cycloaliphatic dianhydride and the aromatic diacid dichloride.

The polyamideimide film prepared by the combination has a high total light transmittance and an excellent modulus as described above, and may decrease a surprising light transmittance in a short wavelength region.

The present invention may manufacture various forms of molded articles using the polyamideimide. As an example, the present invention may be applied to a printed wiring board, a flexible circuit board and the like including a film, a protective film or an insulating film, but not limited thereto. Preferably, the present invention may be applied to a protective film which may replace cover glass, and has a wide application range in various industrial fields including a display.

Hereinafter, the preferred Examples and Comparative Examples of the present invention will be described.

However, the following Examples are only a preferred exemplary embodiment, and the present invention is not limited thereto.

The physical properties of the present invention were measured as follows:

(1) Light Transmittance (Unit: %)

Total light transmittance of the films prepared in the Examples and the Comparative Examples were measured using COH-400 available from Nippon Denshoku in accordance with the ASTM D1003 standard. The light transmittance at 388 nm of the films prepared in the Examples and the Comparative Examples were measured using UV-3600 available from Shimadzu.

(2) Haze

The haze was measured using a spectrophotometer (Nippon Denshoku, COH-400), based on a film having a thickness of 55 pm according to the specification of ASTM D1003. The unit is %.

(3) Modulus

The modulus of the films having a length of 50 mm and a width of 10 mm prepared in the Examples and the Comparative Examples was measured using UTM 3365 available from Instron, under the condition of pulling at 25 mm/min at 25° C.

(4) Viscosity

The viscosity was measured using a Brookfield viscometer (Dv2TRV-cone&plate, CPA-52Z) at 25° C.

(5) Molecular Weight

The weight average molecular weight was measured using 1260 Infinity available from Agilent Technologies, with polystyrene as a standard sample, in which PL gel Olexis was used as the column, and 4 mg contained in 100 ml of LiCl at a concentration of 0.5 wt % with DMAc as a solvent was used as the sample.

COMPARATIVE EXAMPLE 1

Under a nitrogen atmosphere, methylene chloride and 2,2'-bis(trifluoromethyl)-benzidine (TFMB) were added to a reactor and sufficiently stirred, and then terephthaloyl dichloride (TPC) was added thereto and stirred for 6 hours to be dissolved and reacted. Thereafter, an excessive amount of methanol was used for precipitation and filtration to obtain a reaction product, which was dried under vacuum at 50° C. for 6 hours or more, and added again with DMAc to the reactor under the nitrogen atmosphere, and 4,4'-hexafluoroisopropyllidene diphthalic anhydride (6FDA) was added thereto and sufficiently stirred until dissolved, and then biphenyltetracarboxylic dianhydride (BPDA) was added and stirred until dissolved, and then cyclobutanetetracarboxylic dianhydride (CBDA) was added and stirred until dissolved. Subsequently, pyridine and acetic anhydride were added to the solution at 2.5-fold molar amount of the total added amount of dianhydrides, and stirred at 60° C. for 1 hour. Here, the amount of each monomer was such that the mole ratio of TFMB:BPDA:CBDA:6FDA:TPC was 100:10:20:15:55, and the solution was adjusted to have a solid content of 12 wt %. The viscosity of the finally obtained polyamideimide was 33,000 cps, as measured using a Brookfield viscometer at 25° C.

The obtained solution was solution-cast on a glass substrate using an applicator. Thereafter, heat treatment was performed in a vacuum oven at 100° C. for 30 minutes, at 200° C. for 30 minutes and at 300° C. for 30 minutes, and then cooling was performed at room temperature, and the film formed on the glass substrate was separated from the substrate to obtain a polyamideimide film having a thickness of 55 μm. The result of measuring the weight average molecular weight of the film was 205,000 g/mol.

COMPARATIVE EXAMPLE 2

A polyamideimide film having a thickness of 60 μm was prepared in the same manner as in Example 1, except that biphenyltetracarboxylic dianhydride (BPDA) was not used, and a TBIS-MPN(CAS No. 933041-59-9) compound represented by the following Chemical Formula 3 was further included, so that the mole ratio of TFMB:TBIS-MPN:CBDA:6FDA:TPC was 100:5:25:15:55. The weight average molecular weight of the prepared polyamideimide was 195,000 g/mol, and the viscosity of the finally obtained polyamideimide was 28,000 cps, as measured using a Brookfield viscometer at 25° C.

[Chemical Formula 3]

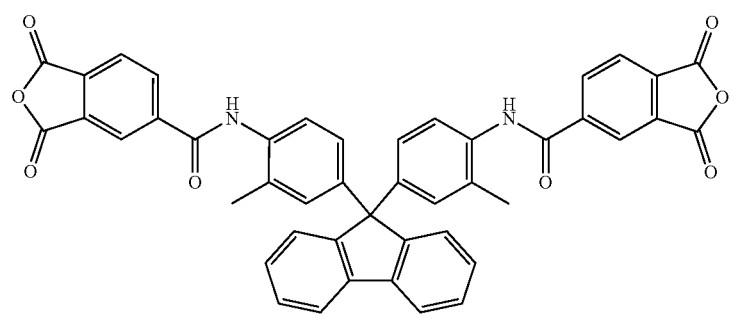

(TBIS-MPN)

EXAMPLE 1

A polyamideimide film having a thickness of 55 μm was prepared in the same manner as in Comparative Example 1, except that biphenyltetracarboxylic dianhydride (BPDA) was not used, and a TBIS-BAN (CAS No. 867350-98-9) compound represented by the following Chemical Formula 2 was further included, so that the mole ratio of TFMB:TBIS-BAN:CBDA:6FDA:TPC was 100:5:25:15:55. The weight average molecular weight of the prepared polyamideimide was 170,000 g/mol, and the viscosity of the finally obtained polyamideimide was 21,000 cps, as measured using a Brookfield viscometer at 25° C.

[Chemical Formula 2]

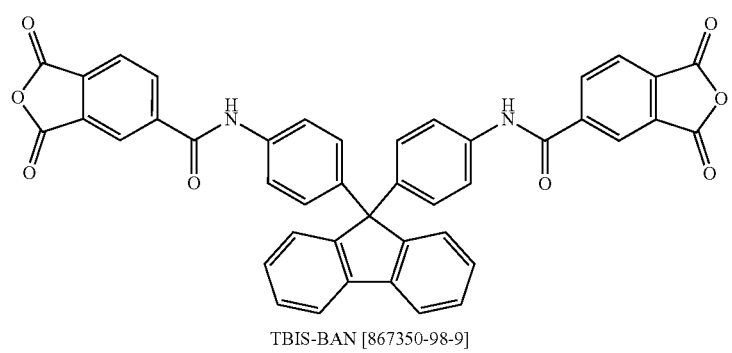

TBIS-BAN [867350-98-9]

EXAMPLE 2

A polyamideimide film having a thickness of 55 μm was prepared in the same manner as in Example 1, except that the content of the TBIS-BAN (CAS No. 867350-98-9) compound was changed, so that the mole ratio of TFMB:TBIS-BAN:CBDA:6FDA:TBC was 100:10:20:15:55. The weight average molecular weight of the prepared polyamideimide was 180,000 g/mol, and the viscosity of the finally obtained polyamideimide was 21,000 cps, as measured using a Brookfield viscometer at 25° C.

COMPARATIVE EXAMPLE 3

A polyamideimide film having a thickness of 50 μm was prepared in the same manner as in Example 1, except that biphenyltetracarboxylic dianhydride (BPDA) was not used, and the mole ratio of TFMB:CBDA:6FDA:TPC was 100:20:25:55. The weight average molecular weight of the prepared polyamideimide was 190,000 g/mol, and the viscosity of the finally obtained polyamideimide was 35,000 cps, as measured using a Brookfield viscometer at 25° C.

COMPARATIVE EXAMPLE 4

A polyamideimide film having a thickness of 58 μm was prepared in the same manner as in Example 1, except that cyclobutanetetracarboxylic dianhydride (CBDA) was not used, and the mole ratio of TFMB:BPDA:6FDA:TPC was 100:20:25:55. The weight average molecular weight of the prepared polyamideimide was 180,000 g/mol, and the viscosity of the finally obtained polyamideimide was 32,000 cps, as measured using a Brookfield viscometer at 25° C.

COMPARATIVE EXAMPLE 5

A polyamideimide film having a thickness of 59 μm was prepared in the same manner as in Example 1, except that biphenyltetracarboxylic dianhydride (BPDA) was not used, and the compound represented by the following Chemical Formula 4 was further included, so that the mole ratio of TFMB:BPAF:CBDA:6FDA:TPC was 100:10:20:15:55. The weight average molecular weight of the prepared polyamideimide was 160,000 g/mol, and the viscosity of the finally obtained polyamideimide was 18,000 cps, as measured using a Brookfield viscometer at 25° C.

[Chemical Formula 4]

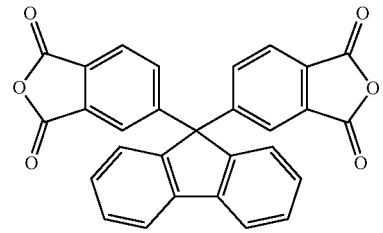

BPAF [135876-30-1] FW 458.42

TABLE 1

| | Thickness (μm) | Total light transmittance (%) | Light transmittance at 388 nm | Modulus (GPa) | Haze (%) |
|---|---|---|---|---|---|
| Example 1 | 55 | 89.5 | 1.5 | 4.3 | 0.26 |
| Example 2 | 55 | 90.0 | 0.08 | 6.3 | 0.18 |
| Comparative Example 1 | 55 | 89.2 | 28.1 | 5.3 | 0.9 |
| Comparative Example 2 | 60 | 90.0 | 36.0 | 4.2 | 0.8 |
| Comparative Example 3 | 50 | 89.8 | 69.5 | 4.8 | 0.9 |
| Comparative Example 4 | 58 | 89.2 | 11.3 | 4.5 | 0.9 |
| Comparative Example 5 | 59 | 90.0 | 58.0 | 4.3 | 0.9 |

As shown in Table 1, it was confirmed that the Examples according to the present invention had an excellent total light transmittance and a high modulus. In particular, it was found that the light transmittance in a short wavelength region measured at 388 nm was all significantly low of 2.0% or less, and thus, UV protection was significantly increased.

However, in the Comparative Examples which did not adopted TBIS-BAN in the present invention, the light transmittance in a short wavelength region measured at 388 nm was as very high as 10% or more, 20% or more, or 30% or more. Also, the haze was 2% or more which is higher than the Examples.

The polyamideimide film according to the present invention may have excellent mechanical physical properties, simultaneously with a low yellow index and an excellent light transmittance in an entire wavelength region of visible light, and implement a significantly low light transmittance in a short wavelength region, and thus, when the polyamideimide film is used as a cover window of a flexible device and the like, surprisingly, UV penetration from outside is prevented, thereby preventing deterioration of an electronic device such as internal OLED to significantly extend a life.

Since the film of the present invention may implement a high modulus and have a significantly low light transmittance in a short wavelength region, ultraviolet ray-induced damage by ultraviolet ray exposure to a lower structure of a display including the polyamideimide film may be prevented, and thus, the polyamideimide film may be applied to various display fields.

Simultaneously, the polyamideimide film may significantly improve a modulus, and implement excellent mechanical strength, thereby being applied various fields including a display.

Hereinabove, although the present invention has been described by the specific matters and specific exemplary embodiments, they have been provided only for assisting in the entire understanding of the present invention. Therefore, the present invention is not limited to the exemplary embodiments, and various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

What is claimed is:

1. A polyamideimide film comprising polyamideimide derived from an aromatic diamine, an aromatic dianhydride, a cycloaliphatic dianhydride and an aromatic diacid dichloride, wherein
   the cycloaliphatic dianhydride includes a compound represented by the following Chemical Formula 1,
   the aromatic dianhydride includes IBIS-BAN (CAS No. 867350-98-9) represented by the following Chemical Formula 2, and
   the polyamideimide film has a total light transmittance of 89% or more, and a light transmittance measured at 388 nm of 10% or less, based on a thickness of 55 um:

[Chemical Formula 1]

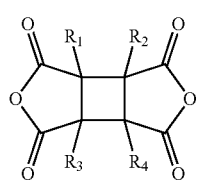

wherein
$R_1$ to $R_4$ are independently of one another, selected from the group consisting of hydrogen, halogen, a $C_1$ to $C_{10}$ alkoxy group or a $C_1$ to $C_{10}$ alkoxy group, wherein a content of the cycloaliphatic dianhydride is 5 to 30 mol, based on 100 mol of the aromatic diamine,

[Chemical Formula 2]

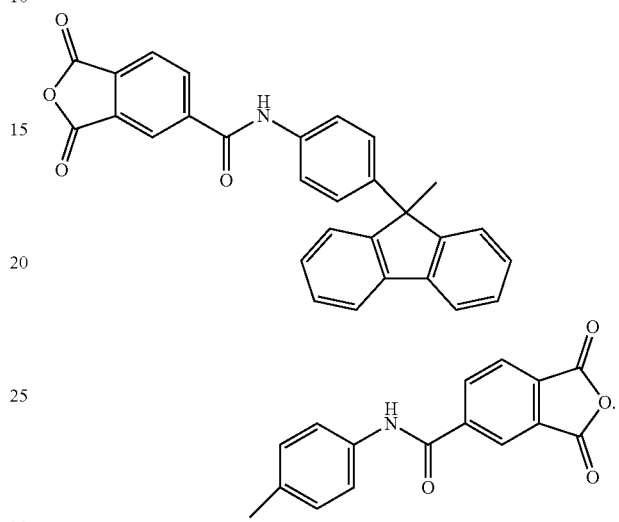

2. The polyamideimide film of claim 1, wherein the aromatic diamine includes 2,2'-bis(trifluoromethyl)-benzidine.

3. The polyamideimide film of claim 1, wherein the aromatic dianhydride further includes 4,4'-hexafluoroisopropylidene diphthalic anhydride.

4. The polyamideimide film of claim 1, wherein the aromatic diacid dichloride includes terephthaloyl dichloride.

5. The polyamideimide film of claim 1, wherein a content of the aromatic diacid dichloride is more than 50 mol, based on 100 mol of the aromatic diamine.

6. The polyamideimide film of claim 1, wherein a content of the aromatic dianhydride is 10 to 50 mol, based on 100 mol of the aromatic diamine.

7. The polyamideimide film of claim 3, wherein a content of the aromatic dianhydride is 5 to 25 mol of 4,4'-hexafluoroisopropylidene diphthalic anhydride and 1 to 30 mol of TBIS-BAN (CAS No. 867350-98-9).

8. The polyamideimide film of claim 1, wherein the polyamideimide film has a modulus of 4.0 GPa or more, as measured at an extension speed of 25 mm/min using UTM 3365 available from Instron.

9. The polyamideimide film of claim 1, wherein the polyamideimide film has a light transmittance of 2% or less as measured at 388 nm based on a film having a thickness of 55 μm.

10. An image display device comprising the polyamideimide film of claim 1.

* * * * *

UNITED STATES PATENT AND TRADEMARK OFFICE
CERTIFICATE OF CORRECTION

| | |
|---|---|
| PATENT NO. | : 11,970,579 B2 |
| APPLICATION NO. | : 17/077676 |
| DATED | : April 30, 2024 |
| INVENTOR(S) | : Hyeon Jeong Kim et al. |

It is certified that error appears in the above-identified patent and that said Letters Patent is hereby corrected as shown below:

In the Claims

Column 19, Line 49, Claim 1, delete "IBIS-BAN" and insert -- TBIS-BAN --

Column 20, Line 4, Claim 1, delete "alkoxy" and insert -- alkyl --

Signed and Sealed this
Twenty-fifth Day of June, 2024

Katherine Kelly Vidal
*Director of the United States Patent and Trademark Office*